United States Patent [19]

King

[11] E Re. 31,151

Best Available Copy [45] Reissued Feb. 15, 1983

[54] INEXPENSIVE SOLAR CELL AND METHOD THEREFOR

[76] Inventor: William J. King, 9 Putnam Rd., Reading, Mass. 01867

[21] Appl. No.: 137,911

[22] Filed: Apr. 7, 1980

Related U.S. Patent Documents

Reissue of:

[64] Patent No.: 4,086,102
Issued: Apr. 25, 1978
Appl. No.: 749,776
Filed: Dec. 13, 1976

[51] Int. Cl.[3] ..... H01L 31/06; H01L 31/18

[52] U.S. Cl. ..... 136/256; 29/572; 29/576 B; 29/578; 29/590; 148/1.5; 204/192 P; 204/192 C; 357/30; 357/52; 357/65; 357/72; 357/90; 357/91; 136/255; 136/244; 427/74; 427/88

[58] Field of Search ..... 136/89 CC, 89 P, 89 SJ, 136/256, 244, 255; 204/192 D, 192 P, 192 C, 192 SP; 148/1.5; 29/572, 576 B, 578, 580, 590; 357/30, 52, 65, 72, 90, 91; 427/74, 88

[56] References Cited

U.S. PATENT DOCUMENTS

| | | | |
|---|---|---|---|
| 3,091,555 | 5/1963 | Smythe | 427/83 |
| 3,361,594 | 1/1968 | Iles | 136/256 |
| 3,533,850 | 10/1970 | Tarneja et al. | 136/256 |
| 3,798,752 | 3/1974 | Fujimoto et al. | 29/571 |
| 3,859,717 | 1/1975 | Green et al. | 29/571 |
| 3,990,097 | 11/1976 | Lindmayer | 357/30 |
| 3,990,100 | 11/1976 | Mimine et al. | 357/30 |
| 4,019,247 | 4/1977 | Borel et al. | 29/578 |

OTHER PUBLICATIONS

J. D. Broder et al., "The Use of FEP Teflon in Solar Cell Cover Technology", *Conf. Record, 10th IEEE Photospecialists Conf.*, Nov. 1973, pp. 272–274.

K. V. Vaidyanathan et al., "The Effect of $Be^{2+}$ Ion Implanted Exponential and Uniform Impurity Profiles on the Electrical Characteristics of GaAs Solar Cells," *Conf. Record, 10th IEEE Photospecialists Conf.*, Nov. 1973, pp. 31–33.

*Primary Examiner*—Aaron Weisstuch
*Attorney, Agent, or Firm*—Russell & Nields

[57] ABSTRACT

Solar cells are manufactured by a simplified method in which a single protective layer acts as an anti-reflection coating and an encapsulation. In cases where the junction is formed by ion implantation techniques, the same layer also serves as the implantation oxide. In addition, this multi-purpose layer may also serve as a mass analyzer, allowing the desired species of ions to reach the surface of the semiconductor but blocking the heavier undesired species. The necessary contacts may be formed prior to implantation, and the use of alloyed aluminum contacts with aluminum oxide passivation permits a simplified contacting procedure. A fully automatic contacting method and configuration for linear materials is also disclosed.

17 Claims, 19 Drawing Figures

INEXPENSIVE SOLAR CELL AND METHOD THEREFOR

Matter enclosed in heavy brackets [ ] appears in the original patent but forms no part of this reissue specification; matter printed in italics indicates the additions made by reissue.

BACKGROUND OF THE INVENTION

One of the projected solutions to the long-term need for energy is the harnessing of solar power to provide an essentially limitless energy source. There are various methods of converting solar energy to a more usable form such as heat or electrical power, among which is photovoltaic conversion, (i.e., the direct conversion of light energy to electrical energy). This is usually accomplished by means of solid state devices called solar cells which can be made from various semi-conductor materials such as silicon (Si), cadmium sulfide (CdS), cadmium telluride (CdTe), gallium arsenide (GaAs), etc. The problems of manufacturing such cells in the enormous quantities required to produce significant electrical output (relative to present U.S.A. capacity of $4\times10^{11}$ watts) have two major areas: the first to produce the necessary basic semiconductor material and the second to process the latter into functional solar cells.

Many approaches have or are being taken to the first problem of producing the basic material. The present invention is concerned with the second area of converting the basic material very economically into functioning solar cells with the objective of considerably simplifying and improving the methods. All basic aspects of the invention have been successfully demonstrated.

SUMMARY OF THE INVENTION

The invention comprehends manufacture of solar cells in which a single layer serves not only as an anti-reflection coating but also as an encapsulant and a mass analyzer. The invention is especially useful in the case of solar cells in which the junction is formed by ion implantation methods, since in that case the same layer also serves as the implantation oxide. The multi-purpose layer must have an index of refraction suitable for proper anti-reflective properties, but I have discovered that this index of refraction is not highly critical and materials whose index of refraction is in the vicinity of the ideal one may be used in accordance with the invention. For a silicon substrate in air, suitable materials for the multi-purpose layer include $Al_2O_3$, $Si_3N_4$, and $SnO_2$. $SiO_2$ is a less suitable material, but may be used in certain circumstances, such as where the desire to use diffusion-manufacturing techniques outweighs the need for excellent anti-reflective properties, so that the surface of the silicon substrate may be converted to $SiO_2$ by simple heating in an oxygen-containing atmosphere. Having selected a suitable material, such as aluminum oxide, the thickness of the layer is then chosen for optimum anti-reflectivity properties. The layer is deposited upon the substrate, and thereafter the junction is formed by bombardment with ions having an energy such that the peak of the dose distribution occurs in the desired relationship to the interface between the layer and the substrate.

In a preferred embodiment of the invention aluminum oxide is used as the multi-purpose layer, and the contact to the front surface of the substrate is formed by aluminum which is suitably placed prior to deposition of the multi-purpose layer, so that during the subsequent annealing step after ion implantation the heat applied causes the aluminum to form an alloyed junction. By using a very thin layer of aluminum over the entire front surface of the silicon substrate, a highly simplified manufacturing process may be carried out. Where alloyed aluminum contacts are employed, if desired, implantation may be carried out prior to deposition of the multi-purpose layer, thereby permitting the use of lower energies of ion implantation. The invention also includes techniques for automatic application of the front contact material so as to provide a completely automatic contacting method and configuration for linear materials.

DETAILED DESCRIPTION OF THE INVENTION

Figure 1:
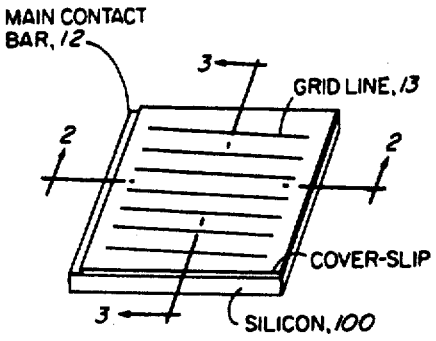
FIG. 1 is a perspective view of a basic silicon solar cell.
Figure 2:
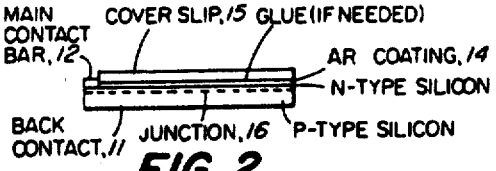
FIG. 2 is a sectional view through line 2—2 of FIG. 1.
Figure 3:
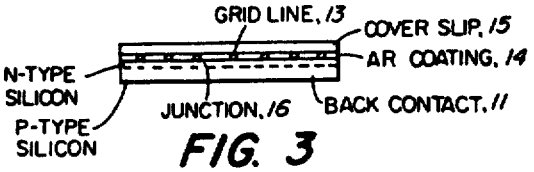
FIG. 3 is a sectional view through line 3—3 of FIG. 1.

The invention can best be understood by reference to a conventional silicon solar cell 10 as shown in FIGS. 1 through 3.

In commercially making such a cell 10, a slice of Si 100 (usually 6–20 mils thick) is polished and cleaned and, after oxidation of the back, a semiconductor junction 16 is formed on the front using diffusion methods. After removal of the back oxide, a full back contact 11 and a front contact consisting of a bar 12 and a series of fingers 13 (grid to reduce series resistance of thin top diffused layer) are applied for extracting the generated electrical current. To improve the collection efficiency for the incident light, a so-called anti-reflection coating 14 is applied to the front surface to reduce the fraction of incident light which is reflected. For space applications, to protect the cell from environmental degradation, a cover slip 15 of suitable material (usually $SiO_2$ or $Al_2O_3$) may be applied, normally with an adhesive but sometimes by methods (e.g. ion beam sputtering) which do not require glue. For terrestrial applications, other encapsulating materials, such as plastics, are being considered.

Figure 4:
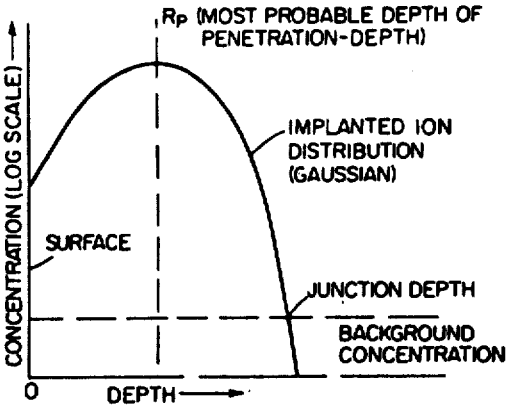
FIG. 4 shows the distribution of implanted ions for a single ion energy, as a graph of the logarithm of concentration versus depth.

Other methods such as Schottky barriers and ion implantation techniques are also used to form the junction 16 which is necessary to separate the light generated electrical carriers in the silicon 100. Improvements on the implantation method form the prime area of this invention although some aspects may be used with other methods of forming the junction. In forming the junction using ion implantation, the usual method is to first form a layer of $SiO_2$ (or equivalent) of an appropriate thickness on the surface and then to implant, using an accelerated beam of "doping" ions through the oxide to form the junction. The oxide is needed because the distribution of implanted ions for a single ion energy is such that the peak $R_p$ is below the surface as shown in FIG. 4. In order to avoid the presence of an electric field which would counteract the flow of carriers in the surface region to the junction where they are separated and to facilitate contacting, it is desirable to place the peak $R_p$ of the distribution at the surface. This is accomplished by having the oxide the same "effective thickness" (depends on material) as $R_p$ (the peak or most probable depth of penetration), so that the peak is at the oxide-silicon interface. The oxide is subsequently removed and contacts, anti-reflection (AR) coating 14 and coverslip 15 are applied as in the conventional case.

Figure 5:
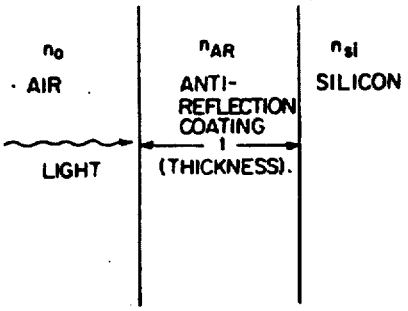
FIG. 5 is a schematic view of light incident on a silicon solar cell with a nonabsorbing anti-reflection (AR) coating on the surface.

Now for light incident on a solar cell having a nonabsorbing layer (e.g. AR, or anti-reflective, coating 14 on surface - see FIG. 5) the intensity reflectance R for normal incidence is given by (see American Institute of Physics Handbook - Second Edition - Chap. 6 g.):

$$r = \frac{r_1^2 + r_2^2 - 2r_1r_2\cos(\nu - \delta)}{1 + r_1^2r_2^2 - 2r_1r_2\cos(\nu - \delta)} \quad (1)$$

-continued $$\text{where } r_1 = \frac{n_{AR} - n_o}{n_{AR} + n_o};\ r_2 = \left[\frac{(n_{si} - n_{AR})^2 + k_{si}^2}{(n_{si} + n_{AR})^2 + k_{si}^2}\right]^{\frac{1}{2}} \quad (2)$$

and $n_{AR}$≡Index of refraction of AR coating
$n_o$≡Index of refraction of air=1
$n_{si}$≡Index of refraction of Si
$k_{si}$≡Extinction coefficient of silicon $$\nu = \frac{4\pi n_{AR}t}{\lambda_o};\ \delta = \tan^{-1}\left(\frac{2\,n_{AR}k_{si}}{n_{AR}^2 - n_{si}^2 - k_{si}^2}\right) \quad (3)$$

≡ phase angle on reflectance at $AR$ — Si boundary $\lambda_o$≡wavelength ($\lambda$) of incident light in vacuum
t=thickness of AR coating
A minimum value of R occurs when $\nu-\delta=2\ m\ \pi$ (where m is an integer) and is given by $$R_{min} = \frac{(r_1 - r_2)^2}{(1 - r_1r_2)^2} \quad (4)$$

Now for a perfect AR coating, $R_{min}=0$ (at one $\lambda$ only) and therefore $r_1=r_2$ $$\frac{n_{AR} - n_o}{n_{AR} + n_o} = \left[\frac{(n_{si} - n_{AR})^2 + k_{si}^2}{(n_{si} + n_{AR})^2 + k_{si}^2}\right]^{\frac{1}{2}} \quad (5)$$

For most practical cases, $k_{si}^2$ is insignificant and (5) reduces to $$\frac{n_{AR} - n_o}{n_{AR} + n_o} = \frac{n_{si} - n_{AR}}{n_{si} + n_{AR}}$$

which reduces to the well-known $$n_{AR} = \sqrt{n_o n_{si}} \quad (6)$$

the latter being more generally given as $$n_1 = \sqrt{n_o n_2} \quad (7)$$

for a layer 1 on a surface 2 in air.

Figure 6:
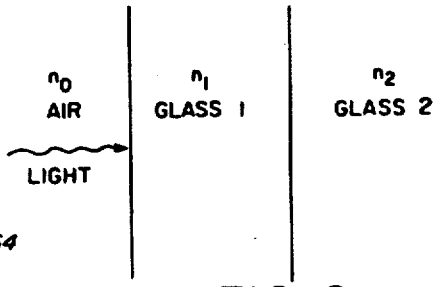
FIG. 6 is a schematic view of light incident on a two element layer composed of two glasses having indices of refraction of $n_1$ and $n_2$.

This is also true for two non-absorbing layers with $n_1 \neq n_2$ and in general $n_2 > n_1$ as shown in FIG. 6 for light incident on a two element layer composed of two glases having indices of refraction of $n_1$ and $n_2$. As an example, if the two materials, 1 and 2, were $SiO_2$ and SiO having indices of 1.45 and 1.95 respectively, the desired index of refraction for material 1 for minimum reflectance is given by $\sqrt{1 \times 1.95}$ or 1.396. An $SiO_2$ layer is a good practical approximation to this value.

The latter example is the case of a cover slip 15 over an AR coating 14 which may itself be on a Si solar cell. However, in this latter case the requirement for the AR coating index is determined by the index of Si and that of the coverslip over the AR coating, so the situation becomes more complicated for optimum performance. Put another way, the value of the index for the AR coating 14 is different if the AR coating is to be covered with a coverslip 15 than if it is to be exposed directly to air or vacuum.

The condition that $n_1=\sqrt{n_o n_2}$ is the first condition for $R_{min}=0$, the second being the aforestated $\nu-\delta=2m\pi$ (m integer).

$\delta$ in most cases is approximately $\pi$ (e.g. for Si is $>179°$) so that $$\nu \cong (2m+1)\pi = \frac{4\pi n_{AR} t}{\lambda_o} \text{ (from (3))} \tag{8}$$

or $$t = \frac{(2m+1)\lambda_o}{4n_{AR}} \quad m = 0, 1, 2,$$

corresponding to the well known thickness condition for destructive interference. For these conditions, which can be precisely true only at one $\lambda_o$ since $n_{si}$ and $k_{si}$ change with $\lambda$, $R_o=0$.

However, it is also "approximately" true at values around $\lambda_o$, and also at other values of $n_{AR}$ near the exact value $\sqrt{n_{si} n_o}$. Although R is not zero it may still be quite low (see below).

As an example of the effect of non-exact values, consider the case of Si for $\lambda_o=6{,}300$ A when $n_{si}=4.0$ and $n_{AR}=\sqrt{4\times 1}=2.0$. For these values $R=0$. If, however, $n_{AR}=1.76$ (corresponding to $Al_2O_3$) and t is still correct as determined from (8)

$$R_{min} = \frac{(r_1-r_2)^2}{(1-r_1r_2)^2} = \left[\frac{\frac{n_{AR}-n_o}{n_{AR}+n_o} - \frac{n_{si}-n_{AR}}{n_{si}+n_{AR}}}{1-\frac{n_{AR}-n_o}{n_{AR}+n_o}\cdot\frac{n_{si}-n_{AR}}{n_{si}+n_{AR}}}\right]^2 =$$

$$\left[\frac{\frac{1.76-1}{1.76+1} - \frac{4-1.76}{4+1.76}}{1-\frac{1.76-1}{1.76+1}\cdot\frac{4-1.76}{4+1.76}}\right]$$

$=0.016$ or 1.6% vs 0 for $R_{min}$ for exact value of $n_{AR}=2$ and vs.

$$\left(\frac{n_{si}-n_o}{n_{si}+n_o}\right)^2 = \left(\frac{4-1}{4+1}\right)^2 =$$

.36 or 36% for bare Si(polished).

Similarly, for a coating of $SiO_2$ with $n=1.45$ one gets $R_{min}=9.7\%$ which is still a significant decrease in reflectivity over that of bare Si.

If these or similar materials are used as the AR coating, and are put down in an hermetic form in thin layers (such as by ion beam sputtering) they can simultaneously perform the function of AR coating and encapsulation. An alternate material having an n value close to the optimum is $Si_3N_4$($n=2.03$), which, however, has some absorption and may not be hermetic in thin layers. The absorption is not likely to be objectionable in the thin layers involved in the present invention, but the exact values remain to be determined. Another material of high interest is $SnO_2$ which has an index of refraction of approximately 2 and which has the added advantage of being conducting under certain conditions, thereby helping to reduce the series resistance of this front layer. Its encapsulating properties for the deposition methods most likely to be used in practicing the present invention are not yet well established, but are likely to be adequate.

Figure 8:
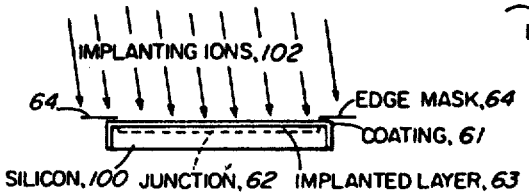
FIG. 8 is a schematic view showing an improved implantation method of the process sequence of FIG. 7B.
Figure 7A:
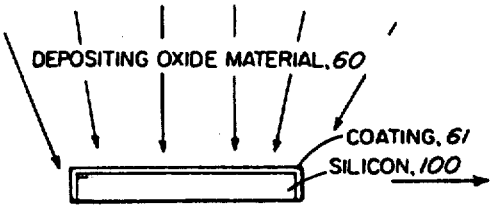
FIG. 7A is a view showing the first step, deposition of oxide material, of a simplified process for coating silicon.
Figure 7B:
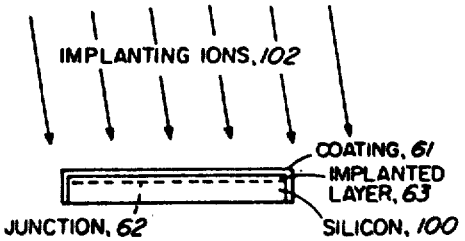
FIG. 7B is a view showing the second step, ion implantation, of the simplified process for coating silicon of FIG. 7A.

It should be noted that for ion beam sputtered $Al_2O_3$ using an extended target system, the sides of the silicon slice will be coated (with oxide coating 61) as well as the front, since the depositing material 60 comes at incidence angles off normal as well as normal (see FIG. 7A). In contrast, the implanting ion beam is near normal (usually $<10°$) so that the implanting ions 102 penetrate into the silicon along the front surface (since energy is chosen for this condition), but are stopped in the oxide 61 along the edges due to its greater effective depth. The junction thus formed is therefore protected from the atmosphere by the oxide 61 along the sides (see FIG. 7B). For even greater certainty in obtaining long range protection against atmospheric attack on the junction (particularly due to humidity) if the edge is not regular, leading to beam shadowing, an edge mask 64 during implantation by ions 102 (see FIG. 8) would place the junction 62 (between the implanted layer 63 and the silicon 100) inside the front edge of the cell, providing complete surface passivation. This could be done with very simple masking and would have essentially zero effect on efficiency; in fact, the relative efficiency could be improved due to improved junction characteristics.

In addition to acting as AR coating and encapsulation, such a layer 61, can also serve as the implantation oxide for controlling the implanted ion peak position. It is only necessary to adjust the ion energy to the value appropriate to the oxide thickness chosen on the basis of AR coating considerations. The total sequence (ignoring contacting and thermal treatment for now) of: Oxidation-Implantation (or Diffusion)-Oxide Removal—AR Coating-Encapsulation reduces to: Combined Coating Application - Implantation (see FIGS. 7A and 7B). Any slight increase in reflectivity is more than balanced by simplicity, particularly if yield and cost are the important factors. A thermal treatment stage is also involved in both conventional implantation and diffusion processing of solar cells but this is not important to the invention as stated above. A proper heat treatment for a particular version of the now simplified process can, however, lead to even greater simplification of the overall process, as discussed later.

It should be noted that if a high temperature heat treatment is involved after application of the combined coating 61, it is desirable, if not necessary, (depending on bond strength) that the coefficient of thermal expansion of the coating match that of the substrate. In the case of a silicon solar cell, it is fortunate that $Al_2O_3$, which is a good choice as an AR material (see above), is also an excellent choice on the base of thermal expansion ($8.7\times10^{-6}$/°C. from 25°-900° C. vs $7.63\times10^{-6}$/°C. for Si at 40° C. - Handbook of Chemistry and Physics, 40th edition). An additional advantage of $Al_2O_3$ for terrestrial cell applications is that if it is properly deposited (e.g. by ion beam sputtering) it is hydrophobic and will tend to be self-cleaning during rain showers, etc.

Once the oxide thickness is set to match the AR requirements, the implantation energy can be adjusted so that a single energy implant will place the peak of the distribution at, or near, the oxide-silicon interface; e.g.

for AR coating peaked at 6,300 A and using $Al_2O_3$ the oxide thickness $$t = \frac{\lambda}{4n} \qquad m = 0$$

$$= \frac{6{,}300}{4 \times 1.76}$$

$$= 895 \text{ A}$$

For this thickness an implant energy of the order of 50 keV would be needed for boron ions. If a thicker encapsulation were needed or desired, one could go to the higher m orders in the thickness calculation; e.g.

$$t = \frac{3\lambda}{4n} \qquad m = 1$$

$$= 2{,}684 \text{ A}$$

for which the required boron implant energy would be approximately 185 keV. Note that in calculating the required implant ion energies, one must take into account the difference between the range of the ions in Si and the AR coating material. These relationships were first developed in depth and are available in "High Energy Ion Implantation of Materials" - Scientific Report No. 1 on Air Force Contract AF 19(628)-4970, May 1966, as well as in other more recent publications.

However, for the smallest implantation machine, lowest AR coating cost, and lowest total cell manufacturing cost, it is preferable to use the thinnest oxide layer possible consistent with hermeticity etc.

Dendritic and EFG (edge defined film fed growth) silicon materials, which have useable surfaces as grown, or suitably prepared conventional (Czochralski or float-zoned) slices, can thus be continuously (i.e. automatically) coated (e.g. by ion beam sputtering) with the multi-purpose coating 61 and then implanted by implantation ions 102 yielding material which, after thermal treatment (to remove implantation radiation damage), is a complete photovoltaic device except for contacting.

Figure 9:
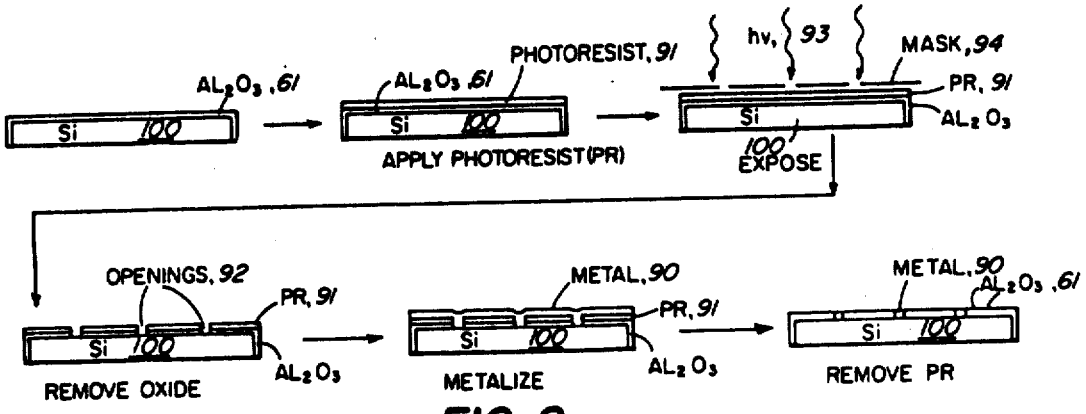
FIG. 9 is a view of the photoresist (PR) contact method for the manufacture of solar cells.

The latter may be accomplished using standard photoresist technology (i.e. applying a photoresist 91 over the oxide coating 61, and exposing the photoresist 91 to energy 93 through a mask 94) on the front surface to remove the oxide 61 where contacts are desired (i.e., forming openings 92), then applying suitable metal contact material 90 over the whole surface (see FIG. 9) and stripping off the remaining photoresist 91 to remove the metal where it isn't required. The entire back is available for applying the back contact.

Figure 10:
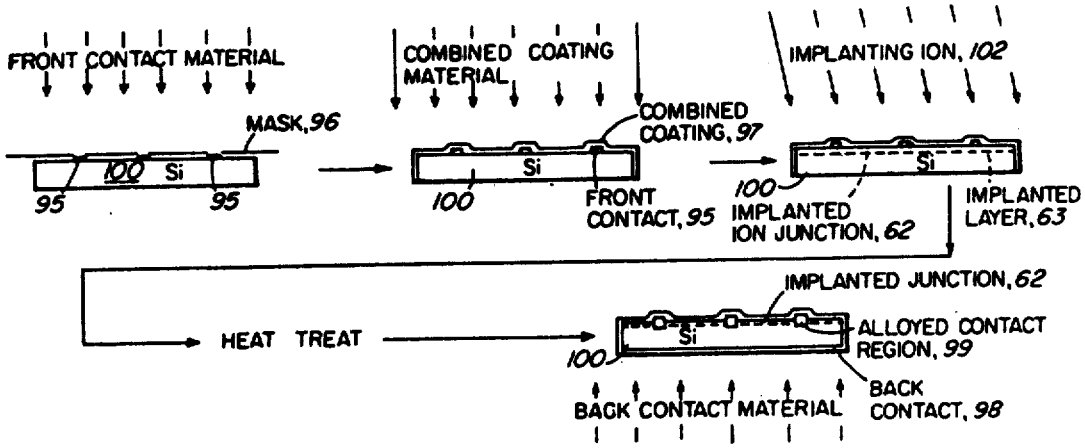
FIG. 10 is a view of a simplified process sequence of the present invention, using front contacts which alloy with silicon at or below the implantation annealing temperature.

The front contacting method described above, although conventional, is complex by the standards which are necessary if solar cells are to be manufactured inexpensively. A preferred method is to make the front contacts out of a suitable material which will alloy the slicon at a temperature at, or below, the implantation annealing temperature. As an example, for a silicon solar cell in which the front and back layers are P- and N- type respectively, the front contacts can be aluminum, which alloys at approximately 577° C. (vs the 600°-1,100° C. used for implantation annealing) and forms P-type material, thereby creating its own junction. The manufacturing sequence can therefore be (see FIG. 10): Apply Front Contacts 95-Apply Combined Coating 97-Implant With Implantation Ions 102-Heat Treat-Apply Back Contact 98.

For this sequence the front contact 95 can be applied using simple masking procedures (with mask 96) which are easier and much less expensive than photoresist methods. Positions for connecting the front contact 95 to the external circuit can easily be attained by suitable masking (on main contact bar) during application of the combined coating 97. The other steps require no masking, only broad beam total coverage being needed. For the usual parameters used, after alloying, the front contact 95 will actually penetrate into the silicon 100 a distance greater than the depth of the implanted ion junction 62, thereby contacting the peak of the implanted distribution, no matter at what depth it occurs. This obviates the need to have the peak of the distribution at the silicon-oxide interface for good contacting. The process sequence can be reordered, if desired, to allow the implantation to be performed before application of the combined coating 97. Energy requirements on the implantation machine will, in the latter case, be only roughly half of those for the through-the-oxide implantation procedure, but the peak of the distribution will occur in the silicon below the oxide-silicon interface. A savings in implantation machine size and eventual manufactured cell cost can therefore be achieved at a possible reduction in cell efficiency resulting from a slight reverse drift field at the cell surface, (see previous comments on implanted profile), and/or possible non-annealable damage effects due to increased surface sputtering.

A special case exists with Al front contacts on a P on N cell, using $Al_2O_3$ (ion beam sputtered or equivalent) as the combined coating. When the cell is heat treated after implantation, the Al alloys with the Si substrate. However, the Al from the $Al_2O_3$ over the contact also segregates and alloys, the rate being determined by the temperature but apparently speeded up due to Al-Si liquidus below it. A few minutes of heat treatment at 1,000° C. reduces all of the $Al_2O_3$ (for 0 order layer) over the contacts, the $O_2$ being evolved, and leaving an alloyed front contact which can be contacted anywhere (easily with ultrasonic bonding using Al leads), the $Al_2O_3$ on the remaining surface staying relatively unchanged with all its necessary properties. In selecting the initial thickness of the $Al_2O_3$ layer, allowance must be made for any subsequent reduction in thickness of said layer caused by the loss of Al to the Si substrate over said remaining surface, and said loss must be kept relatively minor by limiting the duration of said heat treatment to a suitable time.

An important point to note for the case where the heat treatment is carried out at a relatively high temperature e.g. greater than 1,000° C.), even if only for a short time (few minutes) is that some of the Al can diffuse from the Al - Si eutectic, causing a diffused junction in front of the alloyed region 99. This tends to improve the junction characteristics over those of the normal alloyed junctions which tend to be "softer" or more leaky that diffused junctions. Longer times at lower temperatures, where the diffusion coefficients are smaller, could also achieve the same result. This procedure of using alloyed Al contacts and $Al_2O_3$ passivation can be used with many other semiconductor devices and/or integrated circuits and provides a simple method of making highly reliable contacts, especially for "implanted" devices or circuits.

It is noteworthy that $Al_2O_3$ is a preferred material for the combined coating for a P on N cell if higher annealing temperatures are used since any absorption (by whatever process) of the Al (from the $Al_2O_3$) will dope the material properly for device operation. High boron content glasses have the same property (for diffusion of boron from glass into silicon) but do not have as good a match for the index of refraction (AR coating).

A similar technique can be used to provide an alternate method to implantation for doping the front surface between the contact fingers etc. If the entire front surface is coated with a very thin layer of Al before the combined coating is applied, it is possible, "after" the coating is applied, to heat treat the total structure and form an extremely thin alloyed/diffused region (depending on temperature) over the entire front surface. This forms the P-N junction needed for a functional solar cell, and much of the incident light can still penetrate the thin alloyed region to be converted to electrical charges in the bulk material. If temperatures consistent with diffusion are used, a diffused front can be produced in front of the alloyed region for better junction characteristics. However, care must be exercised to restrict the time to a value consistent with the available free Al (i.e. not from $Al_2O_3$ layer) to avoid dissociation of the $Al_2O_3$ layer. Exact values depend on the values chosen for Al layer thickness etc. and are subject to infinite variation. This basic technique has been successfully demonstrated in practice.

Summarizing this technique, it is a method of making a solar cell comprising applying conductive contacts of one surface of a silicon substrate, coating said surface with a film of aluminum sufficiently thin to permit adequate light penetration, putting down in hermetic form upon said coating a thin layer of $Al_2O_3$, and heat treating the total structure at a temperature high enough to alloy said aluminum into said silicon substrate.

The above processing sequence eliminates the need for masking (to allow connection to the front contact) during application of the combined coating. All steps, with the exception of the front contact, are therefore maskless broad beam. An exception would be simple edge masking during implantation for improved encapsulation. The simplified sequence as described above has been successfully demonstrated in practice.

All of the manufacturing steps in the simplified method can be performed sequentially in one automatic machine, completely eliminating manual handling and wet chemistry. Alternately, if it is desired to perform the heat treatment step outside of the machine, which would execute all other steps, this can be achieved by making the back contact also an alloyed type rather than a low temperature surface bonded type. For the P on N cell described above, the back contact can be silver (AG) doped with arsenic (As; N-type dopant) and, if desired (for lower cost and resistivity), covered with a protective layer of nickel (Ni), chromium (Cr), tantalum (Ta) or other suitable environmentally stable material. The Ag alloys with Si at approximately 830° C. so that post-implantation heat treatment at temperatures above this level will simultaneously alloy the front and back contacts and anneal the implantation radiation damage.

Since the solar cell is passivated and the contact material goes into a silicon-metal liquidus state at the annealing temperature, the heat treatment can be carried out under very simple conditions. Successful heat treatment using an Argon gas atmosphere or roughing pump vacuum levels (up to tens of microns pressure) have been achieved in practice.

Figure 11A:
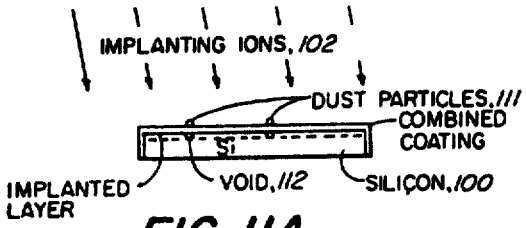
FIG. 11A is a view showing a method of manufacturing solar cells in which a contact is applied after ion beam implantation.

Such contacts, which are fully alloyed with the "bulk" material, are much more durable (non-destroyable without fracturing cell) than contacts which are "surface" bonded or alloyed (e.g. Ti-Ag; i.e. Ti next to Si and overlayed with Ag) since they become an integral part of the bulk material. This is especially important for terrestrial cells which will be expected to withstand ambient environments for periods of 20 years or longer. A very important advantage results from the alloyed front contact-implanted junction technique. In the standard implantation procedure, it is necessary to maintain very clean conditions in order to avoid beam "shadowing" due to dust particles or surface irregularities. As shown in FIG. 11A, if for example, a particle of dust 111 or other particle of a diameter greater than the junction depth equivalent to the implanting ion energy is on the surface, it will shadow the beam 102 (essentially plane parallel even allowing for off normal implant) and leave an unimplanted region or void 112. This unimplanted region 112 is the same type as the original bulk material and acts as a "pipe" from the front surface to the bulk material. If a conventional metal contact is now applied to the front, and is deposited over this unimplanted spot or spots 112, there will be a shorting effect across the junction, degrading the device characteristics. Since implanted junction depths are usually in the 0.1–1 micron range, dust particles of this size can cause this problem. It requires excellent "clean" conditions to reduce the number of such particles to the point where high yield conditions are obtained. This is a particularly bad problem with implanted solar cells because of the large area of the front contact.

Figure 11B:
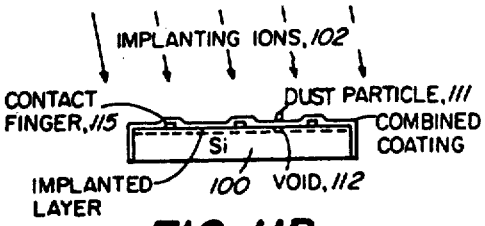
FIG. 11B is a view showing a method of the present invention in which a contact is applied before ion beam implantation.

The procedure outlined above, in which the contact 115 is applied first and alloyed to form its own junction, completely avoids this problem (see FIG. 11B). The entire front surface is exposed to the implanting ion beam 102 such that implantation occurs right up to the alloyed contact 115 to form a continuous junction. The implanted areas 112 under any dust particles 111, etc. have no effect on the junction characteristics, since they are not statistically likely to be touching the contact 115, and even if they were, the contacts themselves are rectifying to the bulk material. The high temperature annealing promotes complete interconnection of the alloyed and diffused junctions to provide perfect contact to the "active" implanted area.

The same technique can be used to facilitate the use of less processed, cheaper starting material for manufacturing solar cells. For example, lapped material can be used rather than the usual highly polished slices. Without the pre-implant contacting method, the microscopic irregularities in the lapped surface can cause beam shadowing since the beam usually intercepts the surface at a non-normal angle (e.g. 7° to the 111 crystallographic plane). Since there are many spots on a lapped surface where this can occur, the probability of significant junction shorting with a conventional, post-implantation contact is very high. The preimplant alloyed contact method completely avoids the problem. Lapped material solar cells have been successfully fabricated by this method.

Another variation of this technique is its use on poorer quality starting material such as dendritic or EFG, which can contain sections or regions having defects which are highly doped and may not be "overcompensated" by the implanted or diffused atoms to create the necessary P-N junction, with pipes or shorting areas resulting from this lack of overcompensation. Again the pre-implant alloyed contacting method avoids the problem because of the very high level of doping introduced by the alloyed region, which will always overcompensate the bulk material (which has a doping level below a solid state "saturation value").

The above general processing methods may be used with any of the conventional starting materials (Czochralski, floatzoned, dendritic, EFG, etc.) of any shape or size and can reduce manufacturing costs through the elimination of handling and wet chemistry steps. For complete, in-line, automatic flow processing, the linear materials such as dendritic or EFG offer significant additional advantages. Since these materials may be grown in controlled widths (fraction of centimeter to many centimeters) and in long (tens of meters) lengths, they tend themselves readily to absolute automation using ion beam techniques for contacting, coating and junction formation etc. For example, EFG material, which is ready for cell manufacturing as grown, would be processed continuously after the crystal is pulled, or off intermediate storage rolls. The problem that remains is to mask (for front contact) material that is flowing continuously in one direction, without manual handling.

Figure 12A:
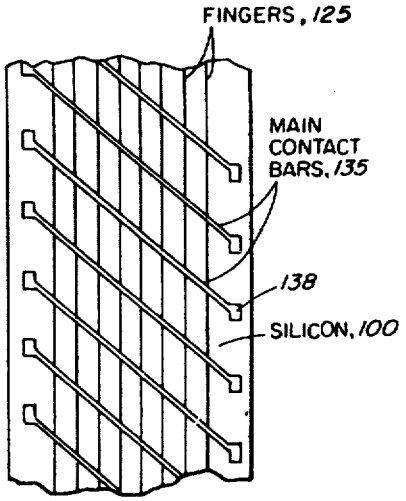
FIG. 12A is a top view showing the contact configuration, as a result of an automatic contact technique of the present invention for linear material.
Figure 12B:
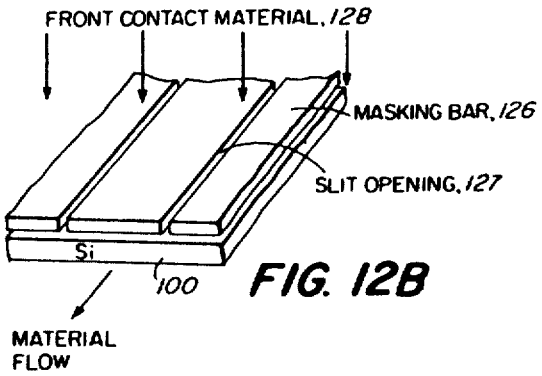
FIG. 12B is an enlarged perspective view showing the masking bars over the solar cell material for front contact fingers, as adapted to the method of the present invention.

Masking may be accomplished by the technique and contact configuration shown in FIGS. 12A through 12E. The narrow fingers 125 used to pick up current from the thin surface layer may be applied in the first operation by ion beam sputtering, evaporating etc. the necessary material through a set of aligned plates or bars 126 producing openings 127 as shown in FIG. 12B. If the plates 126 are sufficiently thick and close to the solar cell material 100 relative to the source of the depositing material 128, narrow contact lines may be deposited continuously on the material 100 which, as shown, is flowing directly out of the page. The size of the plates 126 is not critical since only the relative position of the edges must be adjusted to give the necessary deposited line width. The relative position of the mask plates 126 may also be adjusted with time to keep the line width reasonably constant as deposited material builds up on the edge of the mask as well as on the solar cell material 100.

Figure 12C:
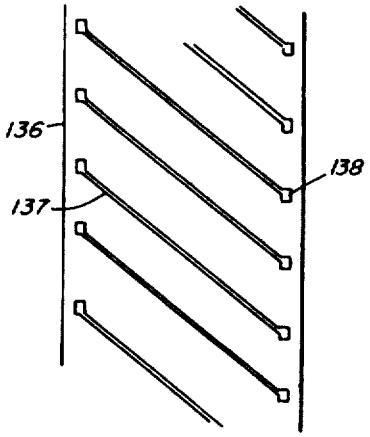
FIG. 12C is a top view of the masking plate for front main contact bars of a solar cell, as adapted for the method of the present invention.

The second operation (to provide main contact bars 135) requires masking sections (plates) 136 as shown in FIG. 12C which would be flipped automatically into direct contact with the material at the start of the machine section, ride with the material until the end of the section, flip off and be recycled (mechanically). Again, the dimensions 137 of the openings are not critical since the material deposited through this mask forms only the main contact bars 135 which are of the order of ½-1 mm., versus mils for the fingers 125. (Note: It would be difficult (although not impossible) to use lay-on masks for the first operation because of the narrowness of the contact fingers. The described method should be simpler, cheaper and requires less maintenance).

Figure 12D:
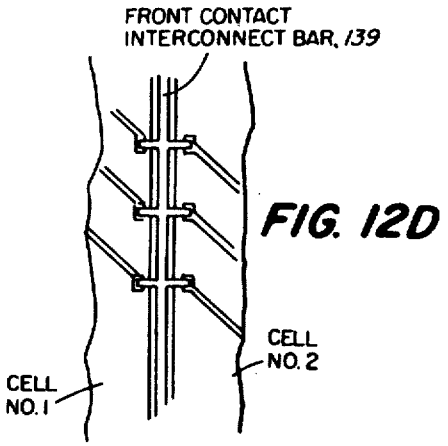
FIG. 12D is a top view showing the interconnection of the front contacts of two solar cells manufactured according to the principles of the present invention.
Figure 12E:
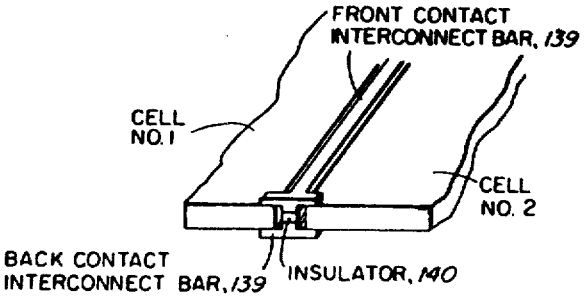
FIG. 12E is a side view showing the interconnection of the front and back contacts of two solar cells manufactured according to the principles of the present invention.

The combination of the first two operations provides a contact pattern as shown in FIG. 12A. The number of fingers 125 may be varied, depending on other design factors, from two to 10 or more per cm., while the spacing between main contact bars 135 is nominally, but not necessarily, of the order of 1 cm. The pads 138 at the end of the contact bars 135 are provided so that sections of long solar cells may be laid side by side and interconnected through simple linear contact bars 139 as shown in FIG. 12D. The same interconnect bars 139 (prefabricated), with appropriate insulating sections 140 can be used to interconnect the back contacts of the cells as shown in FIG. 12E. Alternatively separate back interconnect bars could be used. Pads 138 are provided at both ends of the main cell contact bars 135 for redundancy. If the main contact bars 135 are 0.5 mm wide, loss of active area due to the front contact will be of the order of 6-8%.

The subsequent operations would be broad beam, complete coverage, as described previously, with simple edge masking being used during implantation, if desired. After completion of the final operation, the material could be cut into the desired lengths.

Another modification would be to have the material cut to length before being fabricated into solar cells, thereby facilitating application of the lay-on contact masks 136 (operation 2 of the method shown in FIGS. 12A through 12E) and permitting encapsulation of the ends of the sections for best environmental protection.

The general process as described, although developed for silicon solar cells, has application to other materials. For example, using $SiO_2$, the combined encapsulation - AR coating has been successfully used on CdS solar cells (which are especially susceptible to atmospheric degradation). $Al_2O_3$ with an n of 1.76 vs the desired 1.77 ($\sqrt{3.15}$ for the $Cu_2S$ surface layer used on CdS solar cells), would be an excellent choice for these cells. Other uses for the described methods will be obvious to those skilled in the art. The values and materials chosen are intended to be representative only, not limiting.

Although ion beam sputtering has been used for applying the coatings and contacts in demonstrating this simplified cell processing, other methods of applying these materials with suitable characteristics will result in successful practice of the invention. Such other methods will be obvious to those skilled in the art.

A separate but related use of the multi-purpose coating is to simplify the process for separating out the ions necessary for the implantation process. The problem is that ions of different types, including undesired species as well as the desired species, are extracted from the source. Usually the separation of ions is done by extracting the ions from a suitable source and then passing all of the extracted ions through a mass separator composed of an analyzing magnet or analyzing crossed magnetic and electric fields. These analyzing systems are complicated and expensive and are not readily adapted to extremely large scale production.

A very simple method of obtaining the necessary mass separation can be obtained if the correct doping ions are used for implantation, and the correct gas is used to operate the source. The method primarily involves using the oxide layer 158 (FIG. 13) to act as a "discriminating" ion stopper or absorber. For example, if the desired species is boron and the source is operated on BBr gas, the species extracted from the source will include ions such as $B^+$, $Br^+$, $BBr^{30}$, $B_2^+$, $Br_2^+$, $BBr_2^+$, etc., as well as more highly ionized species such as $B^{++}$, $Br^{++}$, $B_2^{++}$, $Br_2^{++}$, $BBr_2^{++}$, etc. Now $Br^+$, or any of those singly ionized species containing at least one Bn atom, has a range in Si, or any of the oxides used in the present invention, which is much smaller than that of B(e.g. at 100 keV, B range is approximately 0.31μ while Br range is approximately 0.05μ). Therefore, for an energy chosen to place the peak of the boron distribution at the silicon-oxide interface 157, almost all of the bromine will be implanted or stopped in the oxide layer. The oxide layer therefore effectively acts as a mass analyzer allowing the desired species to reach the semiconductor surface but blocking the heavier undesired species.

The more highly ionized species 152 containing bromine present a possible problem since the doubly triply etc. ionized species, after acceleration from the source 154 will have two, three etc. times the energy of the singly ionized species 151. Their effective ranges, in principle, are therefore roughly proportionately longer and a large percentage may not be stopped by the oxide 158. The worse possibility is Br to the third or fourth etc. ionization state. Should this or other similar species occur, the effect can be minimized by passing the beam extracted from the source through a simple electrostatic analyzer 150 of the type familiar to those skilled in the art. Such analyzers separate according to energy and, for ions accelerated through a given potential, therefore pass only ions of a given charge state since ion energy for gap acceleration is the product of the charge times the accelerating potential. If adjusted to pass $B^+$ (and all other singly charged ions), the electrostatic analyzer 150 will separate out all more highly ionized species before they reach the sample 153. The required electrostatic analyzer can be extremely simple, consisting only of a pair of deflection plates connected to a fixed voltage supply. Since Br and its compounds tend to form highly ionized species in the source 154, many of the undesired species will be removed by the electrostatic analyzer 150 and never reach the oxide 158. This has the additional beneficial effect of reducing the "load" (undesired species stopped by the oxide) on the oxide, thereby helping to avoid undesirable changes in its optical properties.

Figure 13:
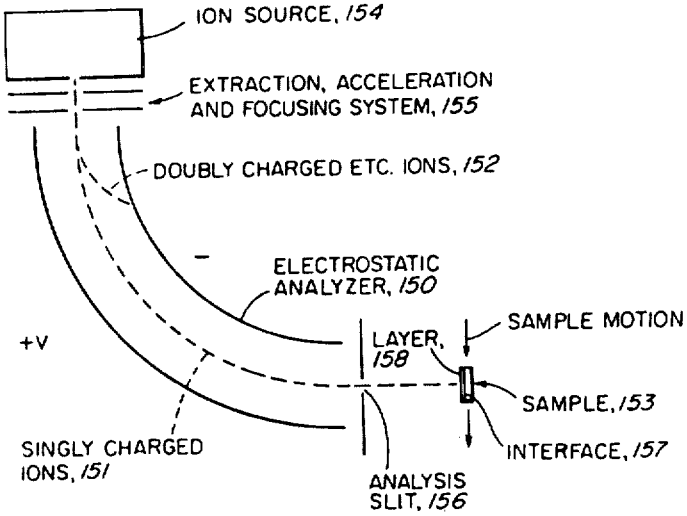
FIG. 13 is a schematic view showing one embodiment of the present invention, in which the multi-purpose layer acts as a mass analyzer.

Hence, as shown in FIG. 13, singly charged ions 151 leaving the ion source 154 pass through an extraction, acceleration and focusing system 155, then through the electrostatic analyzer 150 and through an analysis slit 156 onto the sample 153. In FIG. 13 the higher charged ions 152 will not pass through the electrostatic analyzer 150 onto the sample 153, although it is understood that the electrostatic analyzer 150 can be adjusted to select ion species of any desired charge emerging from the ion source 154.

As is evident from the above example, the function of the oxide layer 158 as a mass analyzer is dependent on the ranges of penetration of the ion species passing through the electrostatic analyzer 150 onto the sample 153. For effective mass analysis by the multi-purpose oxide layer 158, the peak distribution of the undesired ion species should be well within the peak distribution of the desired ion species, such that the thickness of the layer 158 can be adjusted to absorb essentially all of the undesired ion species but still allow the peak of the distribution of the desired ion species to reach the silicon substrate.

For the example chosen above, there will be other ion species extracted due to the action of the Br on internal source parts, internal sputtering, etc., but in general these will also be much heavier than B, or if necessary can be made so by proper source design. The only species which might affect the distribution or operation is $B_2^+$. However, the percentage of this compared to $B^+$ will be small. In addition, such a molecule usually breaks up at the oxide surface into two B ions or neutral atoms having roughly half the energy, and therefore roughly half the range, of a $B^+$ ion extracted from the source. Most of the half energy atoms will end up in the oxide, but since they are of the same species in any event, their effect on the distribution and device operation will be insignificant.

Other source gases such as $BCl_3$ or $BI_3$ (for comparison, at 100 keV ranges of Cl and I are approximately 0.11 and 0.045μ respectively) could be used in the same manner. Other gases familiar to those skilled in the art could be used as well as elemental B from sputtering or similar sources etc. Similar techniques could also be used with other doping ions as well as boron, but the latter is a preferred embodiment because of its low mass (requiring lower implantation energy) and large range separation from undesired species.

Having thus described the principles of the invention together with illustrative embodiments thereof, it is to be understood that although specific terms are employed they are used in a generic and descriptive sense and not for purposes of limitation, the scope of the invention being set forth in the following claims.

We claim:

1. A solar cell comprising a semi-conductor device including a rectifying junction and having a front surface, electrically conductive members in contact with said surface, and a layer of hermetic material hermetically bonded to said front surface and to at least as much of the edge surfaces as is necessary to cover said junction, thereby protecting said junction, said material having an index of refraction and a thickness approximating theoretically calculated values for perfect antireflective [[(AR)]] coating.

2. The solar cell of claim 1 wherein said hermetic material has an index of refraction which is approximately equal to the square root of the index of refraction of the front surface material.

3. The solar cell of claim 1 wherein said device includes a substrate selected from the group consisting of silicon and CdS and wherein said hermetic material is selected from the group consisting of $Al_2O_3$, $Si_3N_4$ and $SnO_2$.

4. The solar cell of claim 1 wherein the front surface has been doped by implanting ions of an impurity element adapted to produce a P-N junction.

5. Method of making a solar cell comprising the following steps in the order given:

(a) applying electrically conductive contacts on the front surface of a semiconductive substrate of given conductivity type;

(b) putting down in hermetic form upon said surface a thin layer of combined antireflective and protective material, said layer having an index of refraction and thickness approximating theoretically calculated values for perfect antireflective coating;

(c) implanting ions of an impurity element of opposite conductivity type through said layer and into said surface of the substrate so as to produce a P-N junction therein;

(d) heating the substrate with its contacts at least to a temperature high enough so that radiation damage due to step (c) is substantially annealed and said contacts alloy with the substrate.

6. Method of making a solar cell having a semiconductive substrate of given conductivity type comprising depositing in hermetic form upon said front surface and to at least as much of the edge surfaces of said substrate as is necessary to cover the P-N junction to be subsequently formed, a protective layer of a material and thickness which result in effective antireflective properties and thereafter implanting ions of an impurity element of opposite conductivity type through said layer and into said substrate so as to produce said P-N junction therein.

7. Method of making a solar cell according to claim 6 wherein the step of implanting ions through said layer and into said substrate is carried out in the presence of an edge mask over an edge of the substrate.

8. Method of making a solar cell according to claim 6 wherein the step of implanting ions is carried out at an ion implantation energy such that the most probable depth of ion penetration lies at or near the interface of said front surface and said layer.

9. Method of making a solar cell according to claim 6 wherein the step of depositing said layer is carried out by means of ion beam sputtering.

10. Method of making solar cells according to claim 6 wherein aluminum contact members are applied to said surface prior to the step of depositing said layer, wherein said layer is $Al_2O_3$, wherein said substrate is N-type silicon, and wherein, after the step of implanting ions, the substrate with its contact members and layer are heated at least to the temperature at which said contact members alloy with said silicon substrate.

11. Method of making a solar cell according to claim 10 wherein the step of applying aluminum contact members comprises ion beam sputtering aluminum onto the silicon substrate through masking means.

12. Method of making a solar cell according to claim 6 wherein said step of implanting impurity element [ion is carried out by passing] *ions includes the step of producing an* accelerated ion beam [through an electrostatic analyzer], and wherein said layer is put down in a thickness sufficient to absorb a substantial amount of at least one *undesired* species of the ions in said ion beam while permitting said *impurity element* ions [to reach the surface of] *to be implanted in* said substrate.

13. Method of making a solar cell comprising the following steps performed in the order given with the exception of step (d) which can be done at any time before step (e):

(a) applying first electrically conductive contacts on a first surface of a semiconductive substrate of given conductivity type;

(b) putting down in hermetic form upon said first surface a thin layer of combined antireflective and protective material; said layer having an index of refraction and thickness approximating the retically calculated values for perfect antireflective coating.

(c) implanting ions of an impurity element of opposite conductivity type through said layer and into said first surface of the substrate so as to produce a P-N junction therein;

(d) applying second electrically conductive contacts on a second surface of the substrate;

(e) heating the substrate with its first and second contacts at least to a temperature high enough so that radiation damage due to step (c) is substantially annealed and both first and second contacts alloy with the substrate.

14. Method of making a solar cell comprising implanting ions of an impurity element of given conductivity type into the front surface of a semiconductive substrate of opposite conductivity type so as to produce a P-N junction therein and thereafter putting down in hermetic form upon said surface and to at least as much of the edge surfaces as is necessary to cover said junction so as to protect said junction a layer of combined antireflective and protective material.

15. Method of making contacts to a semiconductor junction comprising applying masked aluminum upon one surface of an N-type substrate, implanting P-forming ions into said surface, putting down in hermetic form upon said surface a thin layer of $Al_2O_3$, and heat treating[,] the assembly.

16. Method of making a solar cell comprising applying conductive contacts on one surface of an n-type silicon substrate, coating said surface with a film of aluminum sufficiently thin to permit adequate light penetration, putting down in hermetic form upon said coating a thin layer of $Al_2O_3$, and heat treating the total structure at a temperature high enough to alloy said aluminum into said silicon substrate.

*17. Method of making a solar cell according to claim 12, wherein said ion beam is passed through an electrostatic analyzer before reaching said layer for preliminary separating out of undesired ion species.*

* * * * *